(12) United States Patent
Newton

(10) Patent No.: US 8,207,793 B2
(45) Date of Patent: Jun. 26, 2012

(54) MIXING WAVEFORMS

(75) Inventor: Timothy John Newton, Suffolk (GB)

(73) Assignee: Cambridge Silicon Radio Limited, Cambridge (GB)

( * ) Notice: Subject to any disclaimer, the term of this patent is extended or adjusted under 35 U.S.C. 154(b) by 40 days.

(21) Appl. No.: 12/865,123

(22) PCT Filed: Jan. 2, 2009

(86) PCT No.: PCT/EP2009/050006
§ 371 (c)(1),
(2), (4) Date: Aug. 12, 2010

(87) PCT Pub. No.: WO2009/095279
PCT Pub. Date: Aug. 6, 2009

(65) Prior Publication Data
US 2010/0327920 A1 Dec. 30, 2010

(30) Foreign Application Priority Data
Jan. 28, 2008 (GB) .................................. 0801524.0

(51) Int. Cl.
*H03B 21/00* (2006.01)
*H03K 4/02* (2006.01)
*H04L 27/00* (2006.01)
*H04B 1/40* (2006.01)

(52) U.S. Cl. ............. 331/40; 331/42; 327/126; 375/296; 375/316; 455/84; 455/86; 455/114.1; 455/130

(58) Field of Classification Search .................. 327/126; 331/37–43; 375/295, 316; 455/73, 84, 86, 455/91, 114.1, 130
See application file for complete search history.

(56) References Cited

U.S. PATENT DOCUMENTS

| | | | |
|---|---|---|---|
| 4,197,509 A | 4/1980 | Curran et al. | |
| 5,339,345 A | 8/1994 | Mote, Jr. | |
| 6,600,912 B1 | 7/2003 | Stepp et al. | |
| 6,990,155 B2 * | 1/2006 | Adachi et al. ............. | 375/298 |
| 7,421,259 B2 * | 9/2008 | Gomez et al. ............. | 455/130 |
| 7,519,348 B2 * | 4/2009 | Shah ......................... | 455/285 |
| 7,805,122 B2 * | 9/2010 | Lerner et al. .............. | 455/255 |
| 2002/0180538 A1 * | 12/2002 | Soorapanth et al. ....... | 331/74 |
| 2003/0206600 A1 | 11/2003 | Vankka | |
| 2005/0036566 A1 | 2/2005 | Eikenbroek et al. | |

FOREIGN PATENT DOCUMENTS

| | | |
|---|---|---|
| GB | 1062523 A | 3/1967 |
| WO | 2006095283 A2 | 9/2006 |

OTHER PUBLICATIONS

Hooman Darabi et al., "A 2.4 GHz CMOS Transceiver for Bluetooth," IEEE Journal of Solid-State Circuits, IEEE Service Center, Piscataway, NJ, vol. 36, No. 12, Dec. 1, 2001.

* cited by examiner

*Primary Examiner* — Levi Gannon
(74) *Attorney, Agent, or Firm* — Novak Druce DeLuca + Quigg LLP

(57) ABSTRACT

A local oscillator circuit for a signal transmitter or receiver, the circuit comprising: an input for receiving a master oscillating signal from a master oscillator; and signal processing circuitry configured to be clocked by the master oscillating signal to generate a local oscillator signal, the signal processing circuitry being such that the local oscillator signal has substantially no harmonic content at any integer multiple of the frequency of the master oscillator signal, which oscillates at $(2n+1)/2$ times the frequency of the generated local oscillator signal, with n being a positive integer.

10 Claims, 4 Drawing Sheets

MIXING WAVEFORMS

This invention relates to generating waveforms, and especially to generating waveforms suitable for use in upconverting or downconverting signals. Those signals could be ones that are to be transmitted or have been received over a communication channel such as a radio channel.

FIG. 1 is a simplified diagram of one typical form of radio transceiver. The transceiver comprises an antenna 1, a receive chain 2, a baseband processing section 3 and a transmit chain 4.

For reception, signals received at the antenna are filtered by bandpass filter 5, and then downconverted by mixing in mixers 6, 7 with local oscillator signals at 8, 9 to form I and Q signals at the outputs of the mixers. The local oscillator signals are 90° out of phase with each other. The local oscillator signals are generated by a local oscillator 10. The local oscillator is controlled so that the local oscillator signals have a frequency that causes the desired frequency components of the received signal to be shifted into a desired frequency band. The outputs of the mixers are filtered by filters 11, 12 to remove components outside the desired frequency band, and the outputs of the filters are supplied to the baseband processing section 3 for further processing to recover the traffic data from the signals. The processing performed by the baseband processing section 3 will typically be done in the digital domain.

For transmission, data signals generated by the baseband processing section 3 are applied to mixers 13, 14, where they are mixed with I and Q local oscillator signals 15, 16 from a local oscillator 17. This upconverts the data signals to the desired transmission frequency. The outputs of the mixers 13, 14 are combined and amplified by power amplifier 18 and applied to the antenna 1.

There may be additional steps in the transmit or receive chains, for example additional filtering or amplification steps, or additional mixing stages. The local oscillators 10 and 17 could be constituted by a single oscillator. In practice, one or both of the local oscillators might not actually include oscillator circuits but could instead be clocked by a master oscillator. The local oscillators could then perform processing, such as frequency division, on the signal generated by the master oscillator in order to generate their output signals at whatever frequencies are required. This has a number of advantages. Firstly, the local oscillator signals may be required to switch from one frequency to another in order to transmit or receive on different frequencies. This may have to happen rapidly, especially in a frequency-hopping system. By using a master oscillator the frequency of the master oscillator can be stabilised precisely at a single value, providing increased accuracy. Secondly, it can help to avoid oscillator pulling effects, as described in more detail below.

The frequency of such a master oscillator must be carefully selected. One important factor is that it is desirable to minimise the extent to which the output of the master oscillator will be corrupted by other signals in the circuit. In particular, the output of the amplifier 18 will have a relatively high power and could therefore permeate throughout the circuit. This could affect the spectral purity of the master oscillator signal, especially if the signal that is output by the transmit local oscillator 18 has a component at an integer multiple of the master oscillator frequency. To reduce such effects, the frequency of the master oscillator is usually chosen to be significantly above the desired local oscillator frequency. However, this causes problems when the desired local oscillator frequency is already very high. When the desired transmit frequency is in the gigahertz range, it is difficult to build a highly precise master oscillator that operates well above the transmit frequency and also meets other design requirements of low power consumption and low usage of circuit area.

Another approach to reducing such oscillator pulling effects is to upconvert the baseband signal to the transmit frequency in two or more steps, so that the frequency of the master oscillator can be further from the output spectrum of the power amplifier 18. This approach has the disadvantage that it involves increased circuit area and increased power consumption.

There is therefore a need for an improved mechanism for upconverting or downconverting signals.

According to one aspect of the present invention there is provided a local oscillator circuit for a signal transmitter or receiver, the circuit comprising: an input for receiving a master oscillating signal from a master oscillator; and signal processing circuitry configured to be clocked by the master oscillating signal to generate a local oscillator signal, the signal processing circuitry being such that the local oscillator signal has substantially no harmonic content at any integer multiple of the frequency of the master oscillator signal.

The signal processing circuitry may be configured to generate the local oscillator signal at a frequency that is $2/(2n+1)$ times the frequency of the master oscillator signal, where n is a positive integer. Most preferably n is 1, since that satisfies the said relationship with the lowest master oscillator frequency for a desired local oscillator frequency.

The local oscillator signal may have the form of a staircase wave, each of whose cycles includes $2n+1$ steps, each step being substantially equal in duration. The staircase wave may be said to vary between a maximum amplitude A and a minimum amplitude B. Each cycle then preferably includes a step substantially at the maximum amplitude, a step substantially at the minimum amplitude and steps substantially at each of the intermediate amplitudes $B+(A-B)\times k/2n$ where $0<k<n$ and k is an integer.

The transition from one step to another is preferably clocked on a transition of the master oscillator signal. Preferably the transitions to successive steps are clocked on successive transitions of the master oscillator signal.

Preferably the circuit includes a first set of logic elements each for forming a logic signal that has one value during a respective step of the local oscillator signal and another value otherwise, and a summation unit for summing the logic signals to form the local oscillator signal. The values of the logic signals during the respective steps of the local oscillator signal may each be in equal proportion to the level of the respective step.

There may be a feedback loop arranged to compare the master oscillator signal and the local oscillator signal and in response to that comparison adjust the signal processing circuitry to improve nulling of integer multiples of the master oscillator signal in the local oscillator signal.

According to a second aspect of the invention there is provided a signal receiver for receiving signals, the receiver including a circuit as set out above, and at least one mixer for mixing the local oscillator with a received signal.

According to a third aspect of the invention there is provided a transmitter including a circuit as claimed in any preceding claim, and at least one mixer for mixing a locally generated data signal with the local oscillator to form a signal for transmission.

The present invention will now be described by way of example with reference to the accompanying drawings. In the drawings.

Figure 2:
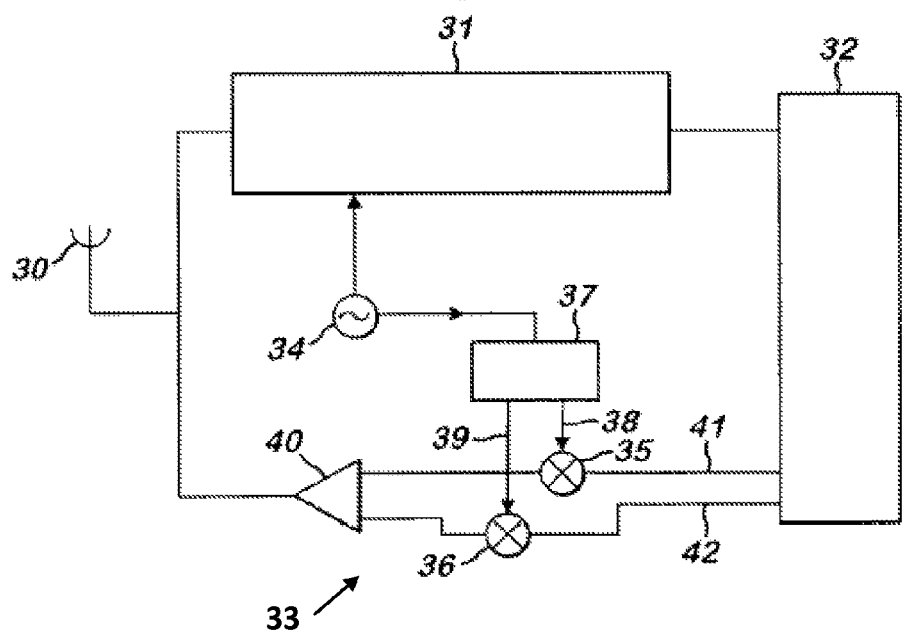
FIG. 2 shows a second simplified radio transceiver.
Figure 3:
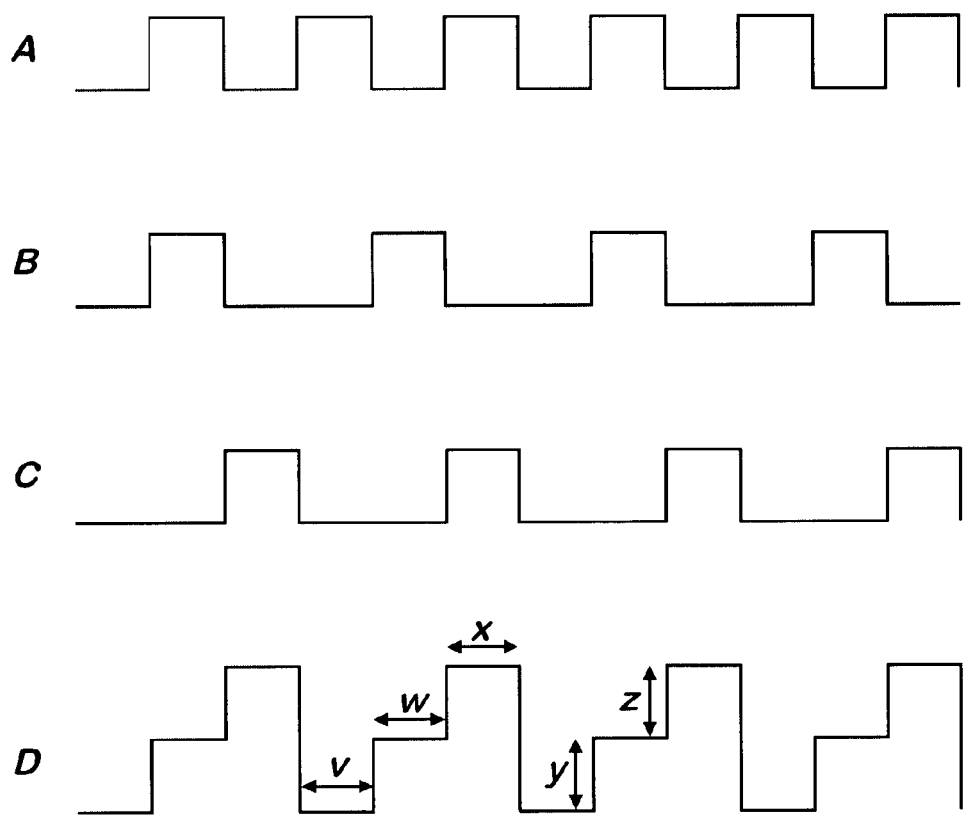
FIG. 3 shows a waveforms present in the transceiver of FIG. 2.

FIG. 3 shows a set of waveforms of signals in the transceiver of FIG. 2. Signal A is the output of the master oscillator. This is selected to be at 1.5 (i.e. 3/2) times the desired frequency of the transmit local oscillator signals. Signal D is one of the transmit local oscillator signals. The waveform of this signal has been formed in such a way that the signal has no or very little harmonic content at multiples of the master oscillator frequency, with the result that oscillator pulling effects are avoided or diminished.

In more detail, the transceiver of FIG. 2 includes an antenna 30, a receive chain 31, a baseband processing section 32, a transmit chain 33 and a master oscillator 34 which is used by both the transmit and receive chains. The master oscillator could be a voltage-controlled oscillator (VCO).

The baseband processing section performs baseband processing of received signals, to detect their content, and of signals that are to be transmitted, by modulating/encoding them as required by the protocol that is in use. Baseband processors of this nature are well known, although normally they accept inputs and generate outputs in accordance with the conventional I/Q technique.

The transmit chain comprises mixers 35, 36, circuitry 37 for generating local oscillator signals 38, 39 and an output power amplifier 40. The circuitry for generating local oscillator signals is clocked by the master oscillator 34, and processes the master oscillator signals to generate the local oscillator signals 38, 39. The local oscillator signals 38, 39 are offset in phase with respect to each other, and are each mixed in a respective one of the mixers 35, 36 with a respective output signal 41, 42 from the baseband processing section 32 to upconvert the signal 41, 42 to the desired radio transmission frequency. The outputs of the mixers 35, 36 are then combined, amplified by the power amplifier 40 and passed to the antenna 30 for transmission. There may be bandpass filters (not shown) between each stage to reduce the effects of out-of-band signals on the purity of the transmitted signal.

Figure 4:
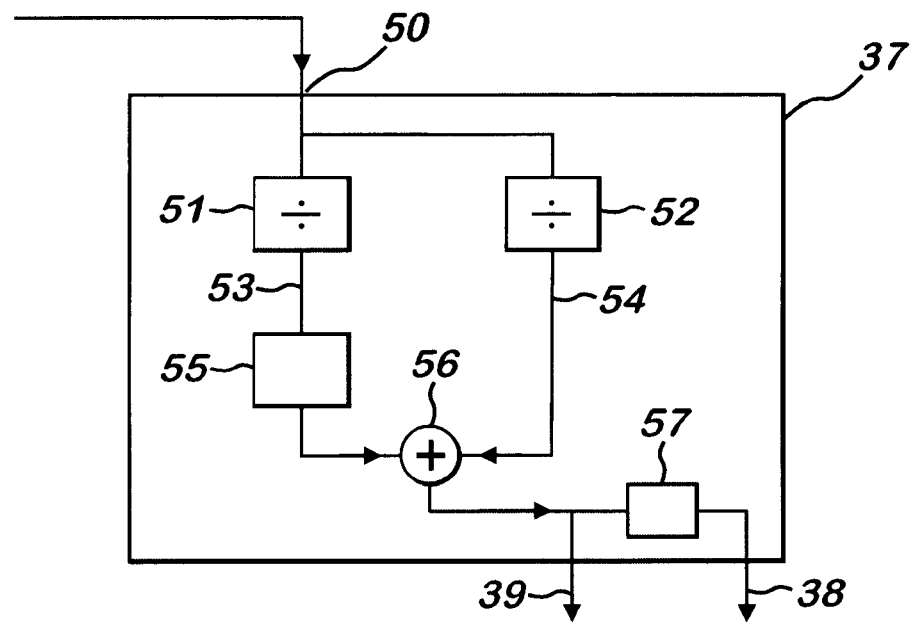
FIG. 4 shows circuitry for generating local oscillator signals.

The circuitry 37 for generating the local oscillator signals 38, 39 is shown in FIG. 4 and will now be described in more detail. In the present system the master oscillator is run at 3/2 times the desired transmit radio frequency; thus if the transmit frequency is 6 GHz, the master oscillator would be run at 9 GHz. (As will be explained below, the multiple of 3/2 is just one example of multiples suitable for use in the present invention). In this example, the circuitry 37 must therefore divide the master oscillator signal by a factor of 1.5 in order to obtain the local oscillator signals. In the present system, the circuitry not only performs such division but also processes the master oscillator signal in such a way as to form the local oscillator signals with a certain desired waveform, which has the property that it has very little harmonic content at integer multiples of the master oscillator frequency.

Referring to FIG. 4, the circuitry 37 receives the master oscillator signal at 50. The waveform of the master oscillator signal is illustrated at A in FIG. 3. In this example the waveform is a square wave having two levels and a 50% duty cycle, so the widths of the blocks of each level in a cycle of the signal are equal. The master oscillator signal is processed in parallel by two divide-by-1.5 frequency divider circuits 51, 52. Each of these is clocked by rising and falling edges of the master oscillator signal so as to form intermediate signals at 53 and 54. The waveforms of the intermediate signals 53, 54 are shown at B and C respectively in FIG. 3. The intermediate signals are each square-wave signals having either of two levels. The frequency of the intermediate signals is 1.5 times that of the master oscillator signal. The width of the pulses at one level (the high level in the example of FIG. 3) is equal to ⅓ of the period of the intermediate signal, so in this example the pulse-width of the pulses of that level equals the pulse-width of the pulses of the master oscillator signal. The intermediate signals differ in that they are out of phase with each other by ⅓ the period of the intermediate signals (i.e. ½ the period of the master oscillator signal). This is achieved by the divide-by-1.5 circuits being clocked in an offset manner by the master oscillator signal, for instance by the master oscillator signal being inverted at the input to one of the divide-by-1.5 circuits. An inverter could be in circuit at the input to one of the dividers for this purpose.

A combined signal which will form the basis for the local oscillator signals to be applied to the mixers is then formed by a weighted analogue summation of the intermediate signals, in which twice the weight is applied to one of the intermediate signals that is applied to the other. In the case where signal B of FIG. 3 is given unit weight and signal C is given double weight this yields the staircase waveform shown at D in FIG. 3. It should be noted that in order to achieve the desired waveform of the local oscillator signal it is the relative weights applied to signals B and C that is significant, not their absolute values. Thus the instantaneous amplitude of the local oscillator signal is proportional to the instantaneous amplitude of signal B plus twice the instantaneous amplitude of signal C. The roles of signals B and C could be reversed. To achieve this the output 53 of divide-by-1.5 circuit 51 is amplified by a factor of 2 in amplifier 55 and then added to the signal at 54 from divide-by-1.5 circuit 52 in an addition node 56.

The waveform D has the property that it has no harmonic content at multiples of the master oscillator frequency. This has the result that pulling effects due to the master oscillator frequency during transmission can be diminished or avoided. The above description is of one preferred waveform. As will be described below, the waveform may differ from the preferred form in practice or in other embodiments.

In order to feed the mixers 35, 36 two local oscillator signals that are out of phase with each other are required. The combined signal D can be fed to one of the mixers as a first local oscillator signal 39. In a separate branch the combined signal D can be fed to a phase-shift unit 57, which shifts its phase by an amount so as to form the other local oscillator signal 38. The amount of the shift can be selected to be any suitable value. Two examples of preferred values are 90° and 270°, since they are compatible with conventional baseband hardware. Another set of preferred values are integer multiples of the step length in the combined signal, in this case 120° or 240°, since they is readily achieved by clocking the phase shift unit with the combined signal itself. The phase-shift unit can, for example, be a delay line or a clocked state unit. If the selected values are not 90° or 270° then the baseband processor can be configured to perform baseband processing accordingly by adapting the normal algorithms to process the received intermediate signals or generate transmit intermediate signals that differ in phase by the phase difference that is in use for the local oscillator signals. Obviously, it is preferred that the selected value is not 0° or 180°.

Instead of shifting the phase of the signal D to form the signal at 38 the signal at 38 could be formed in an analogous circuit that duplicates the x2 amplifier 55 and the addition unit, but with the other of signals B and C being amplified. In this example, the signal analogous to that at 54 would be input to the amplifier and the signal analogous to that at 53 would pass directly to the summation node.

The baseband unit 32 forms its output signals 41, 42 in accordance with the selected phase difference between the two local oscillator signals 38, 39. Each output signal 41, 42 is mixed with the respective local oscillator signal 38, 39 in the respective mixer 35, 36. The outputs of the mixers are combined, amplified by power amplifier 40 and passed to the antenna 30 for transmission.

The waveform of the combined signal output from the summation node 56, and therefore of the local oscillator signals 38, 39 has the form shown at D in FIG. 3. The waveform is of a square staircase form having three levels, one of which is half way between the other two. In each cycle of the signal the combined signal takes each of those values for an equal and contiguous period of time. The staircase may go up or down. The total voltage range of the combined signal can be selected to suit the requirements of the receiver. It is convenient to set one of the levels (either the upper level, the middle level or the lower level) to be at the zero volt level in the context of the transceiver circuit as a whole.

Figure 5:
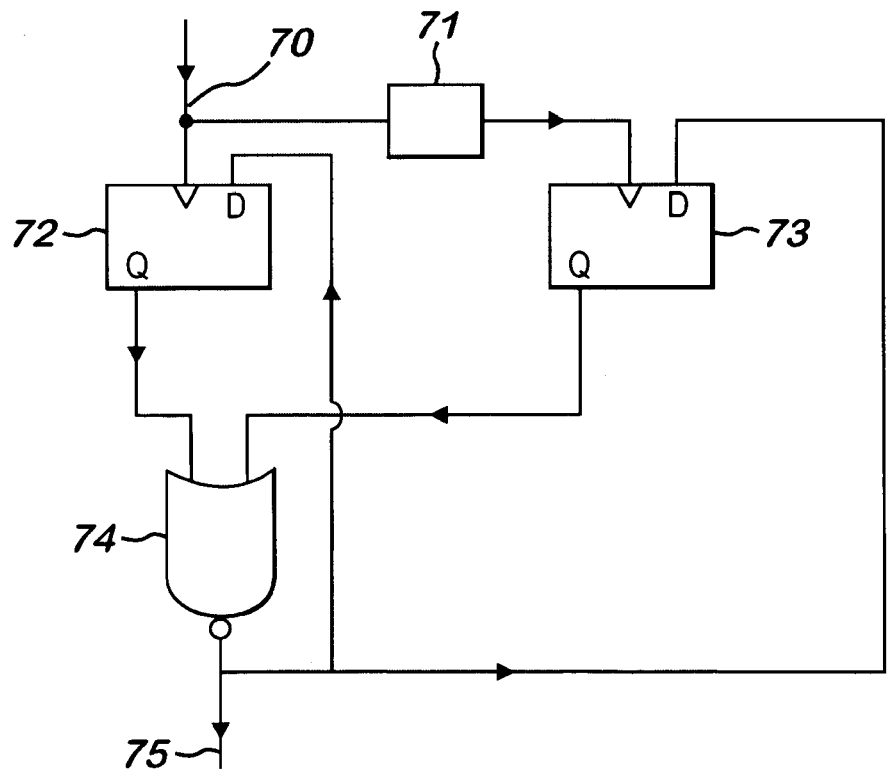
FIG. 5 shows circuitry suitable for use in circuit of FIG. 4.

FIG. 5 shows one design of divide-by-1.5 circuit that could be used. In this circuit an input signal at 70 (which could be the signal at 50 in FIG. 3) clocks a first flip-flop 72. A version of the signal at 70 which has been inverted by inverter 71 clocks flip-flop 73. The non-inverting outputs of the flip-flops are input to a NOR gate 74, whose output at 75 forms the output from the divider circuit. The signal at 75 is also applied to the D inputs of the flip-flops 72 and 73. Other designs of circuits could be used. For example, there could be a look-up table that stores the desired level of the staircase at each step and each transition of the master oscillator signal could trigger the next value to be looked up from the table and applied to a voltage source circuit in such a way as to generate a signal of the appropriate voltage level.

In order to achieve precise nulling of harmonic content at multiples of the master oscillator frequency from the local oscillator signals the time periods shown as v, w and x in FIG. 3 should be set equal to each other, and the amplitudes y and z should be set equal to each other. Of course, the waveform is still advantageous even if harmonic content at multiples of the master oscillator frequency is only partially nulled from the local oscillator signal, since that will still reduce pulling effects. However, it is preferred that steps are taken to reduce such harmonic content to a practical minimum. One way to do so is by precise design of the components of the circuit: especially the master oscillator 34 (to ensure that it has a 50% duty cycle, with the aim that v, w and x are equal), the divide-by-1.5 units 51, 52 (to ensure that they do not distort the timings or amplitude of the master oscillator signal) and the x2 amplifier 55 (to ensure that it does precisely double the amplitude of the signal applied to it, with the aim that y and z are equal).

Figure 6:
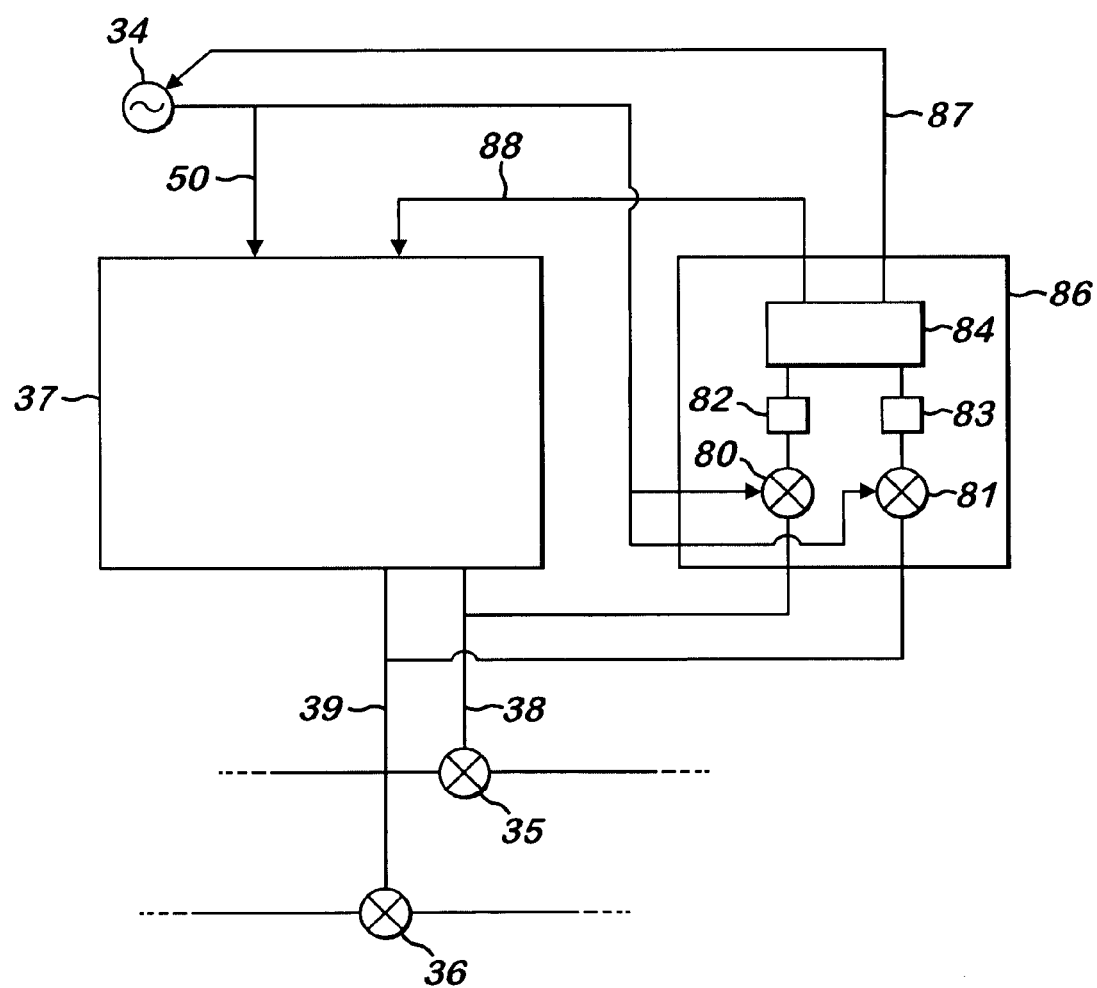
FIG. 6 shows a feedback circuit.

In a typical implementation it will also be possible to tune the performance of the oscillator and the components of the circuitry 37, for example by altering the bias on transistor components of the circuit or by switching alternative components in or out of circuit. FIG. 6 illustrates one way in which that can be done. FIG. 6 shows certain components of the circuit of FIG. 2, which are labelled with the same reference numerals as in FIG. 2, and also a feedback circuit 86. The feedback circuit receives the signals 38, 39 that are input to the mixers 35, 36, analyses them to assess whether they are of the correct form to null multiples of the master oscillator signal from them, and generates feedback signals to the circuitry 37 (i.e. signal 88) and to the master oscillator 34 (i.e.

signal 87) in order to improve such nulling. In the feedback circuit 86 the master oscillator signal 50 is mixed with each of the signals 38, 39 in respective mixers 80, 81. The outputs of those mixers are low-pass filtered in filters 82, 83 and the outputs of those filters are passed to a control circuit 84. The outputs of the filters are indicative of the content of components at multiples of the master oscillator signal in the signals 38, 39. Based on those inputs the control circuit generates the feedback signals 87, 88 to the master oscillator 34 and the circuitry 37 that is in use in order to alter their operation by improving nulling. The details of the feedback signals and hence of the control circuit 84 will depend on the design of master oscillator and of the circuitry 37 that is in use, as will the manner in which the master oscillator and the circuitry 37 respond to the feedback signals.

In the example above the master oscillator operates at 3/2 times the desired frequency. Other multiples could be used instead of 3/2. In general the master oscillator could operate at a multiple M of the desired frequency, where $M=(2n+1)/2$ and n is a positive integer. In each case, the circuitry 37 of FIG. 3 is replaced by circuitry that generates for the local oscillator signals a staircase wave whose cycles each include $2n+1$ steps, each step being substantially equal in duration. If the signal occupies a voltage range V, each step of a cycle is offset by substantially $V/2n$ from the preceding step of the cycle if the staircase is an ascending staircase, or by substantially $-V/2n$ if the staircase is descending.

Figure 1:
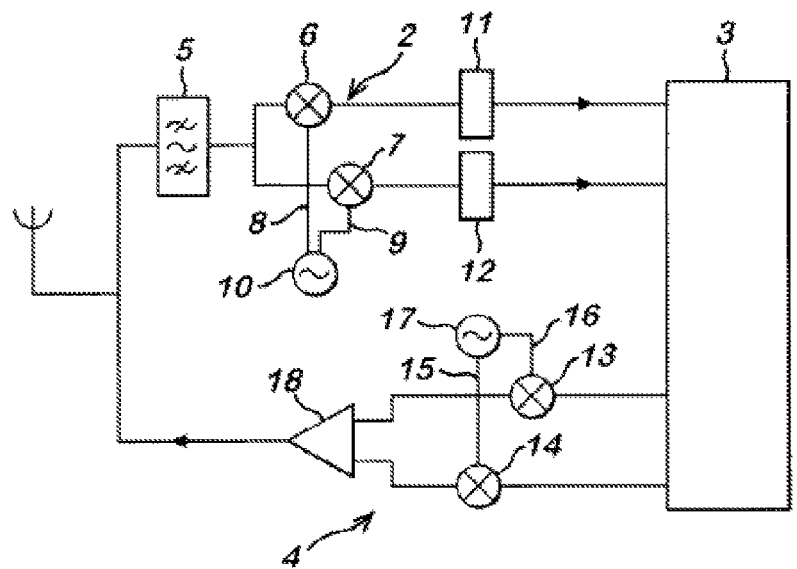
FIG. 1 shows a simplified radio transceiver.

The receive chain of the device of FIG. 2 is not shown in detail but could include mixers analogous to those of the receiver of FIG. 1. Those mixers could be fed by similar local oscillator signals to those described above, formed by oscillator 34 and/or by circuit 37 and/or by other circuitry which could for example be analogous to circuitry 37.

The frequency of the master oscillator could be varied in accordance with the transmit or receive frequency that is to be used at any time. Alternatively, the frequency of the master oscillator could be held fixed and a variable frequency divider introduced to alter the frequency that is input to the transmit and/or receive circuits.

The master oscillator frequency could be multiplied or divided to arrive at the desired receive frequency. The resulting signal could be applied to one of the receive mixers; and could also be phase-shifted by 90°, with that phase-shifted signal being applied to the other receive mixer. This provides a quadrature receiver arrangement.

If the frequency that is desired to be applied to the receive mixers is ⅔ times the frequency of the master oscillator then a convenient alternative is to feed the receive mixers with signals that are offset by 60° (equivalent to −120° or +240°) or 120° (equivalent to −60°) from each other. Signals of those offsets are convenient because they can readily be formed so as to have such a phase offset by making use of clocking on edges of the master oscillator signal. The signals fed to the mixers can conveniently be of the form shown at D in FIG. 3, and formed in an analogous manner. If this approach is used, the baseband processing section should process the received signals taking account of the 60° or 120° (rather than 90°) phase shift.

The transmitter and/or the receiver could have multiple mixing stages in series and the principles described above could be used at any of those stages.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A local oscillator circuit for a signal transmitter or receiver, the circuit comprising:
   an input arranged to receive a master oscillating signal from a master oscillator; and
   signal processing circuitry configured to be clocked by the master oscillating signal to generate a local oscillator signal, the signal processing circuitry being such that the local oscillator signal has substantially no harmonic content at any integer multiple of the frequency of the master oscillator signal;
   wherein the local oscillator signal has the form of a staircase wave, each of whose cycles includes 2n+1 steps, each step being equal in duration and where n is a positive integer; and
   where, if the local oscillator signal occupies a voltage range V, each step of a cycle is offset by V/2n from the preceding step of the cycle if the staircase is an ascending staircase, or by −V/2n if the staircase is descending.

2. A local oscillator circuit as claimed in claim 1, wherein the signal processing circuitry is configured to generate the local oscillator signal at a frequency that is 2/(2n+1) times the frequency of the master oscillator signal.

3. A local oscillator circuit as claimed in claim 2, where n is 1.

4. A local oscillator circuit as claimed in claim 1, wherein the transition from one step to another is clocked on a transition of the master oscillator signal.

5. A local oscillator circuit as claimed in claim 4, wherein the transitions to successive steps are clocked on successive transitions of the master oscillator signal.

6. A local oscillator circuit as claimed claim 4, wherein the circuit includes a first set of logic elements each for forming a logic signal that has one value during a respective step of the local oscillator signal and another value otherwise, and a summation unit for summing the logic signals to form the local oscillator signal.

7. A local oscillator circuit as claimed in claim 6, wherein the values of the logic signals during the respective steps of the local oscillator signal are each in equal proportion to the level of the respective step.

8. A local oscillator circuit as claimed in claim 1, comprising a feedback loop arranged to compare the master oscillator signal and the local oscillator signal and in response to that comparison adjust the signal processing circuitry to improve nulling of integer multiples of the master oscillator signal in the local oscillator signal.

9. A signal receiver for receiving signals, the receiver including a circuit as claimed in claim 1, and at least one mixer for mixing the local oscillator with a received signal.

10. A signal transmitter for transmitting signals, the transmitter including a circuit as claimed in claim 1, and at least one mixer for mixing a locally generated data signal with the local oscillator to form a signal for transmission.

* * * * *

UNITED STATES PATENT AND TRADEMARK OFFICE
CERTIFICATE OF CORRECTION

| | |
|---|---|
| PATENT NO. | : 8,207,793 B2 |
| APPLICATION NO. | : 12/865123 |
| DATED | : June 26, 2012 |
| INVENTOR(S) | : Timothy John Newton |

It is certified that error appears in the above-identified patent and that said Letters Patent is hereby corrected as shown below:

In column 2, lines 59-60, "claimed in any preceding claim" is corrected to --as set out above--

Signed and Sealed this
Twenty-sixth Day of February, 2013

Teresa Stanek Rea
*Acting Director of the United States Patent and Trademark Office*